United States Patent
Miura et al.

(10) Patent No.: US 12,148,840 B2
(45) Date of Patent: Nov. 19, 2024

(54) SEMICONDUCTOR DEVICE AND METHOD FOR MANUFACTURING THE SAME

(71) Applicant: Japan Display Inc., Tokyo (JP)

(72) Inventors: Kentaro Miura, Tokyo (JP); Hajime Watakabe, Tokyo (JP); Ryo Onodera, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 441 days.

(21) Appl. No.: 17/542,515

(22) Filed: Dec. 6, 2021

(65) Prior Publication Data

US 2022/0181493 A1 Jun. 9, 2022

(30) Foreign Application Priority Data

Dec. 7, 2020 (JP) ................................. 2020-202722

(51) Int. Cl.
*H01L 29/786* (2006.01)
*H01L 29/66* (2006.01)

(52) U.S. Cl.
CPC ...... *H01L 29/7869* (2013.01); *H01L 29/6675* (2013.01); *H01L 29/78672* (2013.01)

(58) Field of Classification Search
CPC ............. H01L 29/7869; H01L 29/6675; H01L 29/78672
USPC ........................................................ 257/79
See application file for complete search history.

(56) References Cited

U.S. PATENT DOCUMENTS

| | | | |
|---|---|---|---|
| 2011/0049507 A1* | 3/2011 | Choi | H01L 27/1251 438/34 |
| 2011/0049523 A1* | 3/2011 | Choi | H01L 27/1225 438/34 |
| 2017/0278872 A1 | 9/2017 | Ohara | |
| 2020/0259020 A1 | 8/2020 | Watakabe et al. | |
| 2021/0005738 A1* | 1/2021 | Okazaki | H01L 29/78648 |
| 2021/0020665 A1* | 1/2021 | Yamazaki | H10K 50/00 |
| 2022/0165826 A1* | 5/2022 | Hanada | H10K 71/00 |

FOREIGN PATENT DOCUMENTS

| | | |
|---|---|---|
| JP | 2017-183312 A | 10/2017 |
| JP | 2020-129635 A | 8/2020 |

* cited by examiner

*Primary Examiner* — Igwe U Anya
(74) *Attorney, Agent, or Firm* — XSENSUS LLP

(57) ABSTRACT

According to one embodiment, a method for manufacturing a semiconductor device includes forming a first insulating layer above a polycrystalline silicon semiconductor, forming an oxide semiconductor on the first insulating layer, forming a second insulating layer on the oxide semiconductor, forming contact holes penetrating to the polycrystalline silicon semiconductor in insulating layers including the first insulating layer and the second insulating layer, forming a metal film on the second insulating layer, forming a patterned resist on the metal film, etching the metal film using the resist as a mask, performing ion implantation into the oxide semiconductor without removing the resist, and removing the resist.

9 Claims, 13 Drawing Sheets

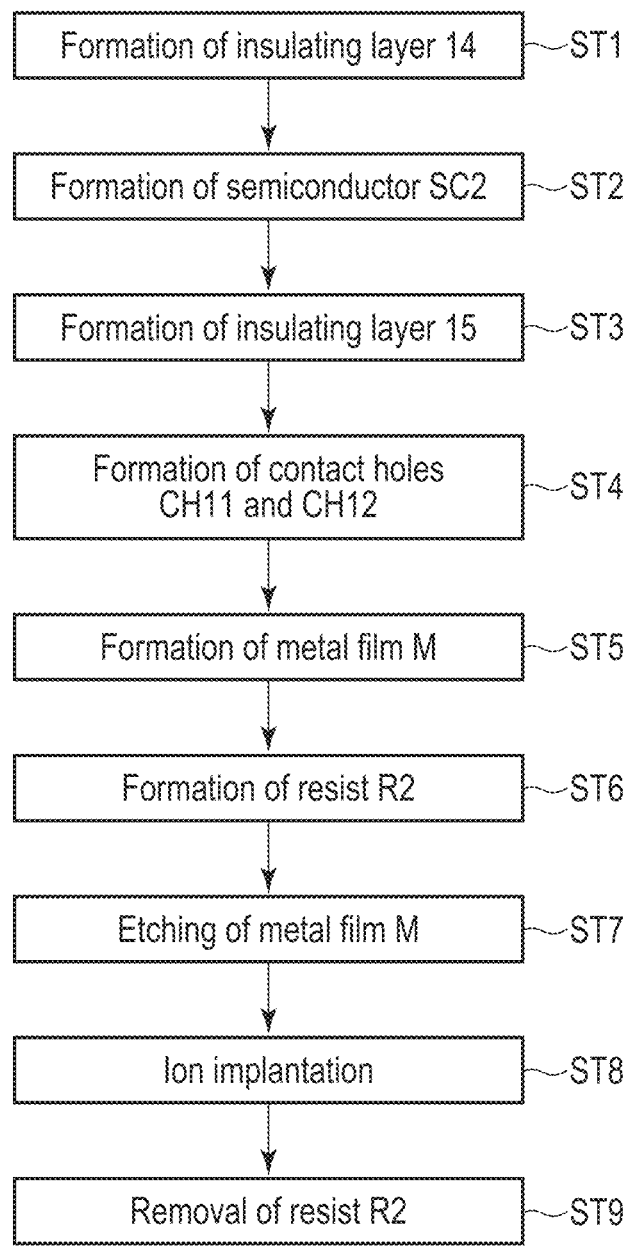
F I G. 2

F.I.G. 3

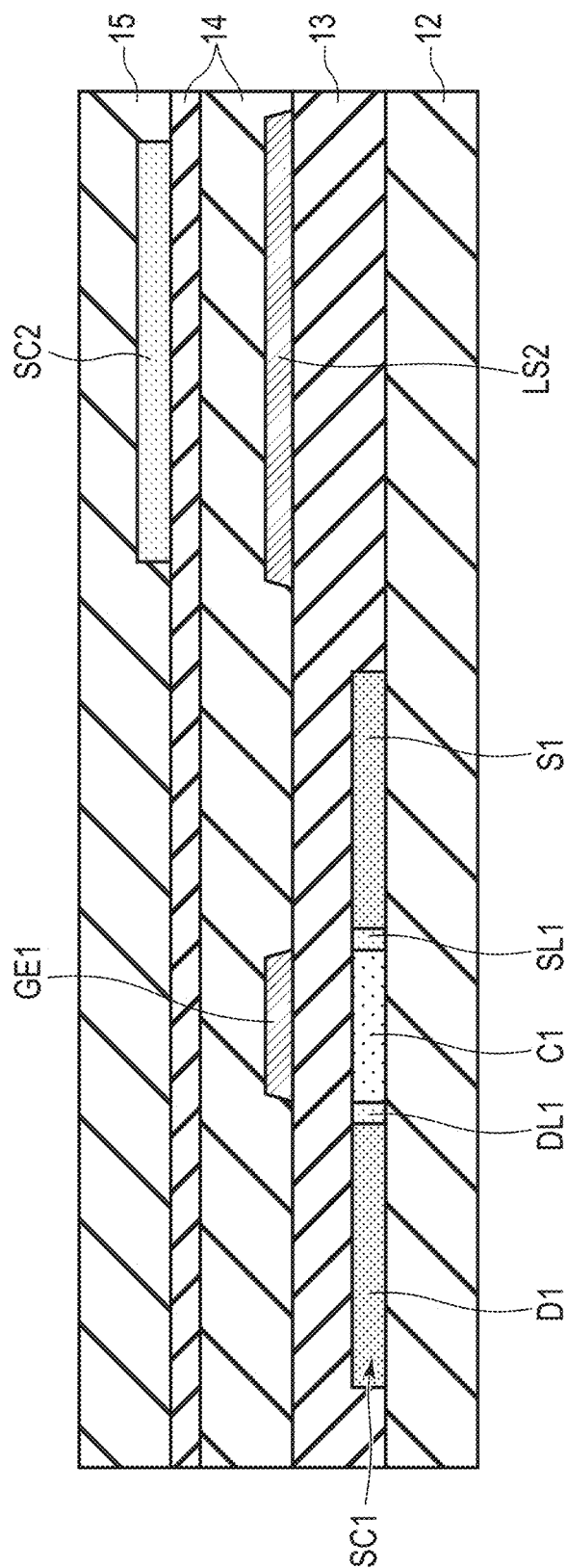
F I G. 4

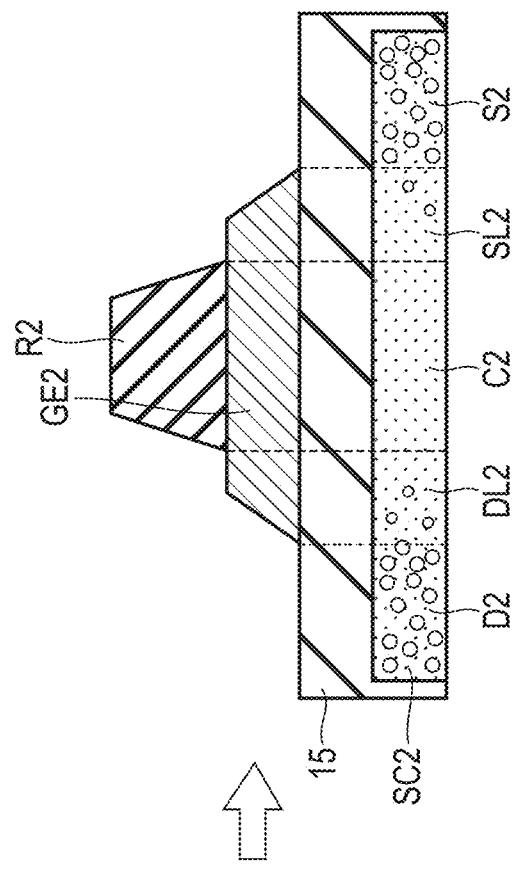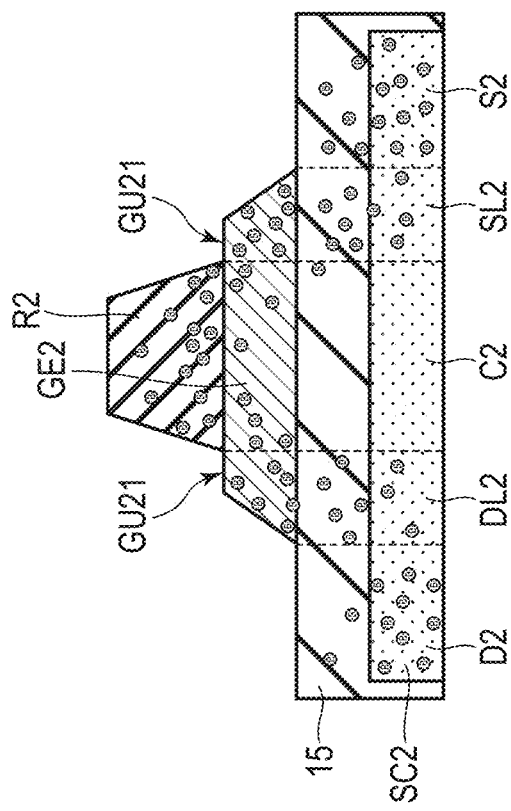
FIG. 15

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2020-202722, filed Dec. 7, 2020, the entire contents of which are incorporated herein by reference.

FIELD

Embodiments described herein relate generally to a semiconductor device and a method for manufacturing the same.

BACKGROUND

In, for example, a liquid crystal display device, such a technology is proposed that a transistor comprising an oxide semiconductor is disposed in a pixel circuit in a display area and a transistor comprising a silicon semiconductor is disposed in a drive circuit in a peripheral area.

BRIEF DESCRIPTION OF THE DRAWINGS

FIG. 2 is an illustration for explaining a method for manufacturing transistors TR1 and TR2.

FIG. 4 is a cross-sectional view for explaining the method for manufacturing the transistors TR1 and TR2.

FIG. 15 is a cross-sectional views schematically showing impurity distribution and oxygen deficiency distribution after ion implantation.

DETAILED DESCRIPTION

Figure 1:
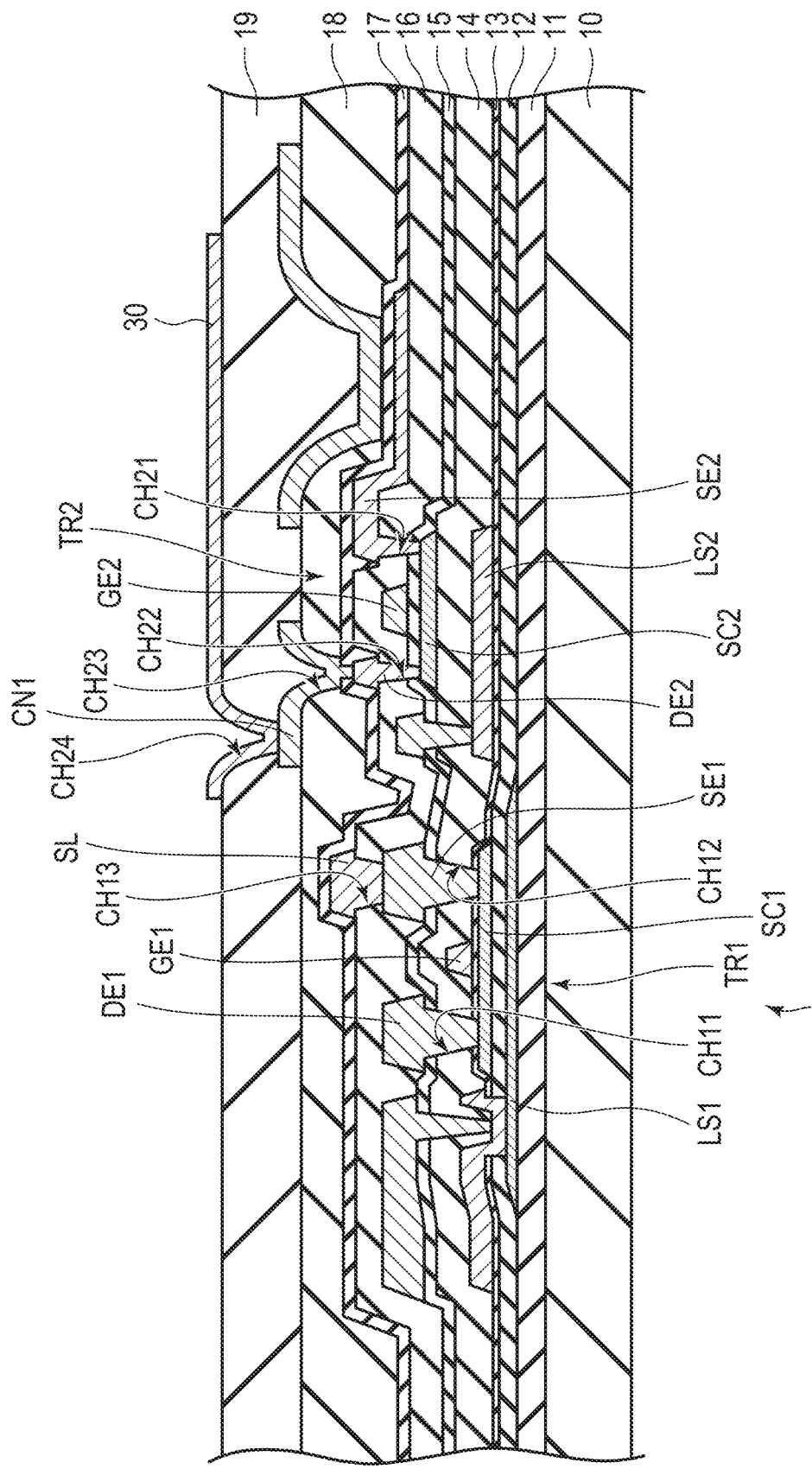
FIG. 1 is a cross-sectional view showing a configuration example of a semiconductor device 1 according to the present embodiment.

In general, according to one embodiment, there is provided a method for manufacturing a semiconductor device comprising forming a first insulating layer above a polycrystalline silicon semiconductor, forming an island-shaped oxide semiconductor on the first insulating layer, forming a second insulating layer on the oxide semiconductor, forming a first contact hole and a second contact hole penetrating to the polycrystalline silicon semiconductor in a plurality of insulating layers including the first insulating layer and the second insulating layer, forming a metal film on the second insulating layer, forming a patterned resist on the metal film, etching the metal film using the resist as a mask and forming a gate electrode overlapping the oxide semiconductor and a source electrode and a drain electrode being in contact with the polycrystalline silicon semiconductor respectively in the first contact hole and the second contact hole, performing ion implantation into the oxide semiconductor without removing the resist, and removing the resist.

According to another embodiment, there is provided a semiconductor device comprising a base, a polycrystalline silicon semiconductor arranged above the base, a first gate electrode overlapping the polycrystalline silicon semiconductor, a first insulating layer arranged above the first gate electrode, an oxide semiconductor arranged on the first insulating layer, a second insulating layer covering the oxide semiconductor, and a second gate electrode arranged on the second insulating layer and overlapping the oxide semiconductor and a source electrode and a drain electrode being in contact with the polycrystalline silicon semiconductor. The oxide semiconductor contains impurities. The second insulating layer has a first overlapping area overlapping the source electrode, a second overlapping area overlapping the second gate electrode, and a peripheral area surrounding the first overlapping area and the second overlapping area. An impurity concentration of the first overlapping area is equal to an impurity concentration of the second overlapping area. An impurity concentration of the peripheral area is higher than the impurity concentrations of the first overlapping area and the second overlapping area.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed description thereof which is considered redundant is omitted where appropriate.

In the drawings, in order to make understanding easier, an X-axis, a Y-axis and a Z-axis which are orthogonal to each other are shown as needed. A direction along the X-axis is referred to as an X direction or the first direction, a direction along the Y-axis is referred to as a Y direction or the second direction, and a direction along the Z-axis is referred to as a Z direction or the third direction. A plane defined by the X-axis and the Y-axis is referred to as an X-Y plane, and viewing the X-Y plane is referred to as planar view.

A semiconductor device 1 according to the present embodiment can be applied to various display devices such as a liquid crystal display device, an organic electroluminescent display device, an electrophoretic display device and an LED display device, various sensors such as a capacitive sensor or an optical sensor, and other electronic devices.

FIG. 1 is a cross-sectional, view showing a configuration example of the semiconductor device 1 according to the present embodiment.

The semiconductor device 1 comprises a base 10, insulating layers 11 to 19, transistors TR1 and TR2 and an element electrode 30.

The transistor TR1 comprises a semiconductor SC1, a gate electrode (first gate electrode) GE1, a source electrode (first source electrode) SE1 and a drain electrode (first drain electrode) DE1. The semiconductor SC1 is, for example, a polycrystalline silicon semiconductor but may be another silicon-based semiconductor. The gate electrode GE1 is an electrode electrically connected to a gate line. The source electrode SE1 is an electrode electrically connected to a source line SL.

The transistor TR2 comprises a semiconductor SC2, a gate electrode (second gate electrode) GE2, a source electrode (second source electrode) SE2 and a drain electrode (second drain electrode) DE2. The semiconductor SC2 is, for example, an oxide semiconductor. The gate electrode GE2 is an electrode electrically connected to a gate line. The source electrode SE2 is an electrode electrically connected to a source line, a power line or the like. The drain electrode DE2 is an electrode electrically connected to the element electrode 30.

The base 10 is formed of an insulating material such as glass or resin film. The base 10 may be referred to also as an insulating substrate or a transparent substrate. The insulating layer 11 is arranged on the base 10.

A light shielding layer LS1 is disposed to correspond to the transistor TR1, is arranged on the insulating layer 11, and is covered with the insulating layer 12. The light shielding layer LS1 is, for example, a metal layer. The semiconductor SC1 is located directly above the light shielding layer LS1, is arranged on the insulating layer 12, and is covered with the insulating layer 13.

The gate electrode GE1 is located directly above the semiconductor SC1, is arranged on the insulating layer 13, and is covered with the insulating layer 14. The gate electrode GE1 has the same potential as the light shielding layer LS1, for example.

The source electrode SE1 and the drain electrode DE1 are arranged on the insulating layer 15 and are covered with the insulating layer 16. These source electrode SE1 and drain electrode DE1 are in contact with the semiconductor SC1 respectively via contact holes CH11 and CH12 penetrating the insulating layers 13 to 15.

The source line SL is arranged on the insulating layer 16 and is covered with the insulating layer 17. The source line SL is in contact with the source electrode SE1 via a contact hole CH13 penetrating the insulating layer 16.

A light shielding layer LS2 is disposed to correspond to the transistor TR2, is arranged on the insulating layer 13, and is covered with the insulating layer 14. The gate electrode GE1 and the light shielding layer LS2 are metal layers located in the same layer and formed of the same material. The semiconductor SC2 is located directly above the light shielding layer LS2, is arranged on the insulating layer 14, and is covered with the insulating layer 15.

The gate electrode GE2 is located directly above the semiconductor SC2, is arranged on the insulating layer 15, and is covered with the insulating layer 16. The gate electrode GE2 has the same potential as the light shielding layer LS2, for example. The gate electrode GE2, the source electrode SE1 and the drain electrode DE1 are metal layers located in the same layer and formed of the same material.

The source electrode SE2 and the drain electrode DE2 are arranged on the insulating layer 16 and are covered with the insulating layer 17. These source electrode SE2 and drain electrode DE2 are in contact with the semiconductor SC2 respectively via contact holes CH21 and CH22 penetrating the insulating layers 15 and 16. The source electrode SE2, the drain electrode DE2 and the source line SL are metal layers located in the same layer and formed of the same material.

A connection electrode CN1 is arranged on the insulating layer 18 and is covered with the insulating layer 19. The connection electrode CN1 is in contact with the drain electrode DE2 via a contact hole CH23 penetrating the insulating layers 17 and 18. The connection electrode CN1 is, for example, a transparent electrode formed of a transparent conductive material such as indium tin oxide (ITO) or indium zinc oxide (IZO) but may be a metal layer.

The element electrode 30 is arranged on the insulating layer 19, and is in contact with the connection electrode CN1 via a contact hole CH24 penetrating the insulating layer 19. The element electrode 30 constitutes the pixel electrode, the lower electrode, the anode, the cathode or the like of various electronic devices. The element electrode 30 is, for example, a transparent electrode formed of a transparent conductive material such as ITO or IZO. The element electrode 30 may be a metal electrode formed of a metal material such as silver or aluminum. In addition, the element electrode 30 may be a stack of a transparent electrode and a metal electrode. For example, the element electrode 30 may be composed as a stack of a transparent electrode, a metal electrode and a transparent electrode stacked in order or may be composed as a stack of three or more layers.

The insulating layers 11 to 17 are, for example, transparent inorganic insulating layers formed of silicon nitride (SiN), silicon oxide (SiO) or the like. The insulating layers 11 to 17 each may be a single layer formed of a single insulating material or may be a stack of layers formed of a plurality of insulating materials.

The insulating layers 18 and 19 are transparent organic insulating layers formed of polyimide or the like.

Next, an example of the method for manufacturing the transistors TR1 and TR2 shown in FIG. 1 will be described.

FIG. 2 is an illustration for explaining the method for manufacturing the transistors TR1 and TR2. FIGS. 3 to 10 are cross-sectional views showing main processes shown in FIG. 2. The illustration of the base 10 and the insulating layer 11 is omitted in the cross-sectional views of FIGS. 3 to 10.

Figure 3:
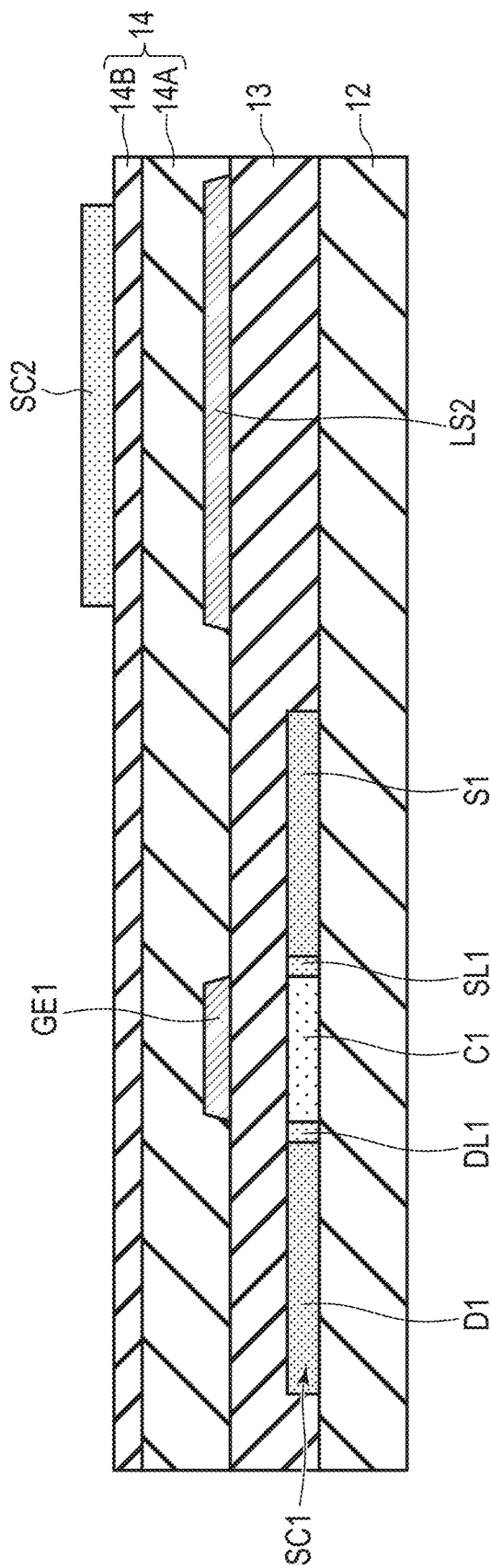
FIG. 3 is a cross-sectional view for explaining the method for manufacturing the transistors TR1 and TR2.

First, as shown in FIG. 3, after the semiconductor (polycrystalline silicon semiconductor) SC1, the insulating layer 13, and the gate electrode GE1 and the light shielding layer LS2 are formed, silicon nitride is deposited to form a thin film 14A, and then silicon oxide is deposited to form a thin film 14B (step ST1). The stack of the thin film 14A and the thin film 14B corresponds to the insulating layer (the first insulating layer) 14 described above.

Then, an oxide semiconductor film is formed on the insulating layer 14 (or the thin film 14B), and the oxide semiconductor film is patterned. Accordingly, as shown in FIG. 3, the island-shaped semiconductor (oxide semiconductor) SC2 is formed directly above the light shielding layer LS2.

Before the oxide semiconductor SC2 is formed, the semiconductor SC1 is doped with impurities using the gate electrode GE1 and the like as a mask, and a channel area C1, a source area S1 and a drain area D1 are formed. The doped impurities are phosphorus (p) in the case of an n-channel type and are boron in the case of a p-channel type.

The illustrated example corresponds to an n-channel type, and the semiconductor SC1 has a low-resistance area SL1 between the source area S1 and the channel area C1, and a low-resistance area DL1 between the drain area D1 and the channel area C1.

The low-resistance areas SL1 and DL1 have a higher impurity concentration and a lower resistance than the channel area C1. The source area S1 and the drain area D1 have a higher impurity concentration and a lower resistance than the low-resistance areas SL1 and DL1. The impurity concentration in the specification can be represented as the number of impurities per unit volume.

Then, as shown in FIG. 4, silicon oxide is deposited on the insulating film 14 and the semiconductor SC2, and the insulating layer (second insulating layer) 15 is formed (step ST3). Accordingly, the semiconductor SC2 is located between the thin film 14B and the insulating layer 15 which are silicon oxide.

Figure 5:
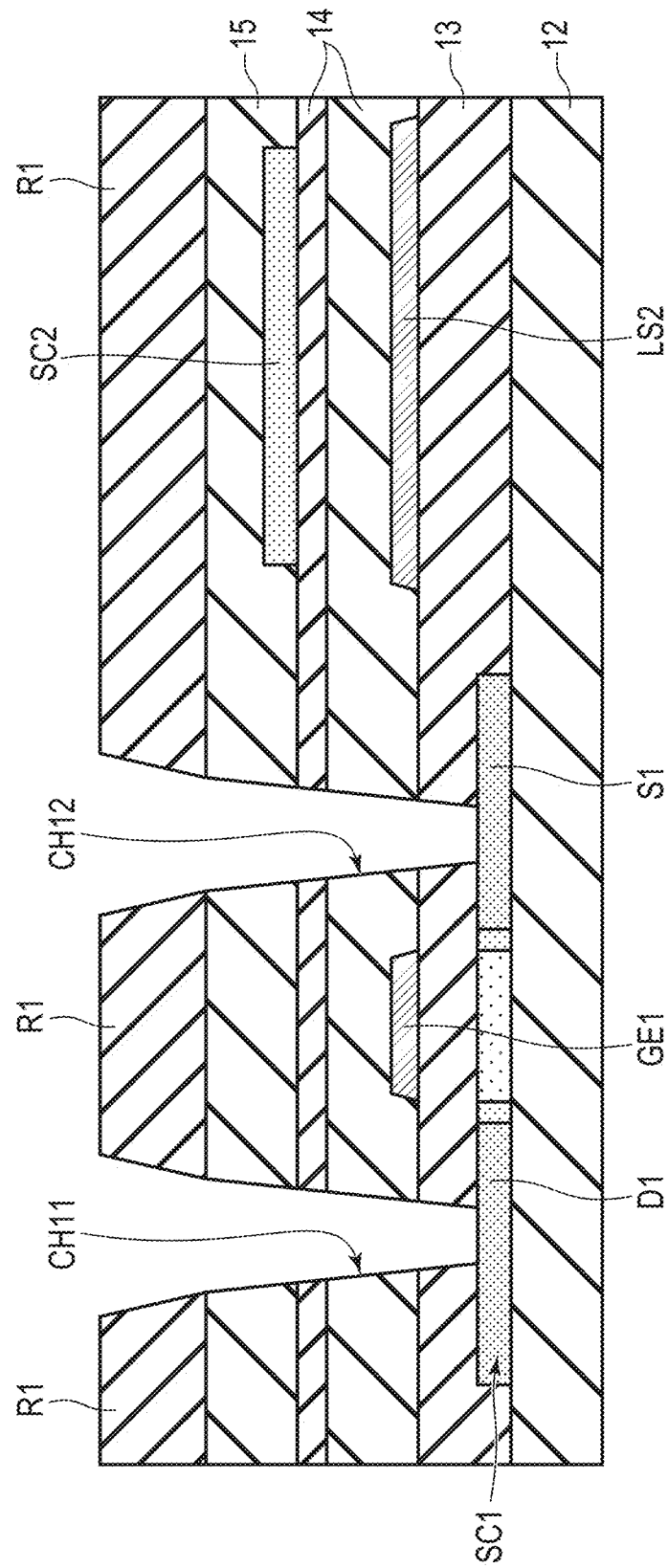
FIG. 5 is a cross-sectional view for explaining the method for manufacturing the transistors TR1 and TR2.

Then, as shown in FIG. 5, a patterned resist R1 is formed on the insulating layer 15, the insulating layers 13 to 15 are etched using the resist R1 as a mask, and the contact holes CH11 and CH12 penetrating the insulating layers 13 to 15 to the semiconductor SC1 are formed (step ST4). A part of the drain area D1 is exposed in the contact hole CH11, and a part of the source area S1 is exposed in the contact hole CH12.

It should be noted that contact holes penetrating to the semiconductor SC2 are not formed at this stage. That is, the insulating layer 15 in an area overlapping the semiconductor SC2 is covered with the resist R1. After the contact holes CH11 and CH12 are formed, the resist R1 is removed.

Figure 6:
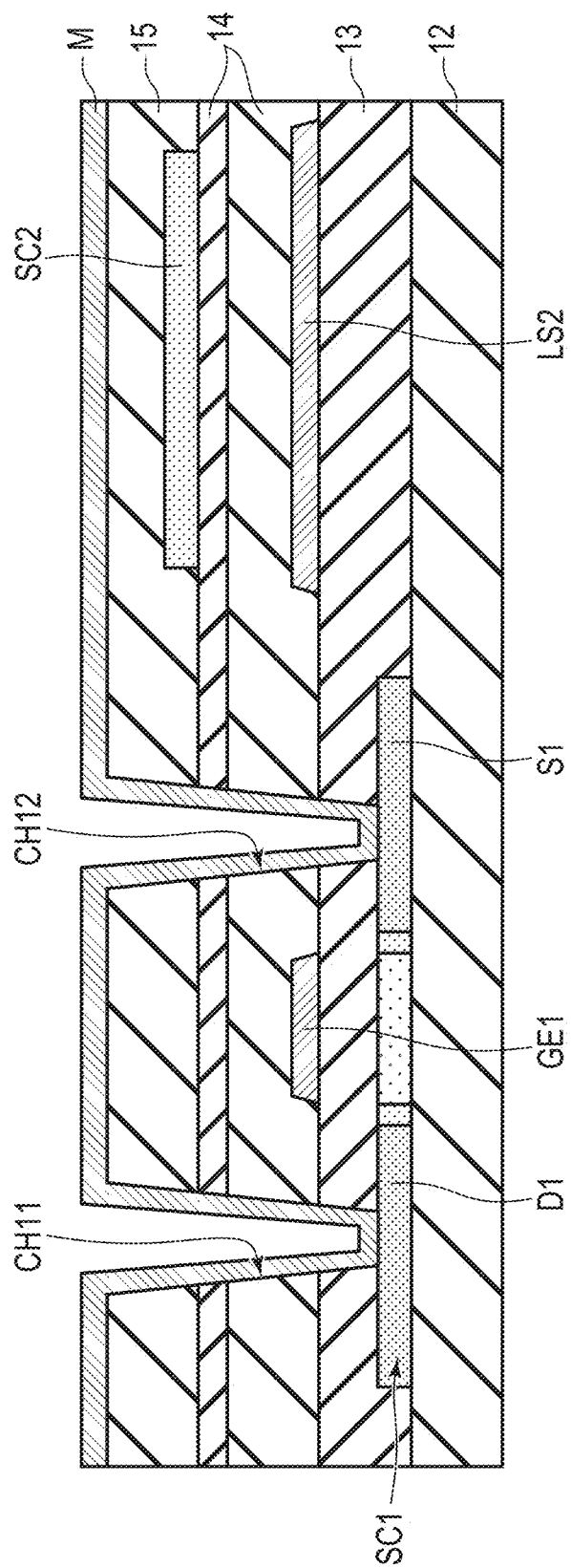
FIG. 6 is a cross-sectional view for explaining the method for manufacturing the transistors TR1 and TR2.

Then, as shown in FIG. 6, a metal film M is formed on the insulating layer 15 (step ST5). The metal film M is in contact with the drain area D1 in the contact hole CH11, and is in contact with the source area S1 in the contact hole CH12.

Figure 7:
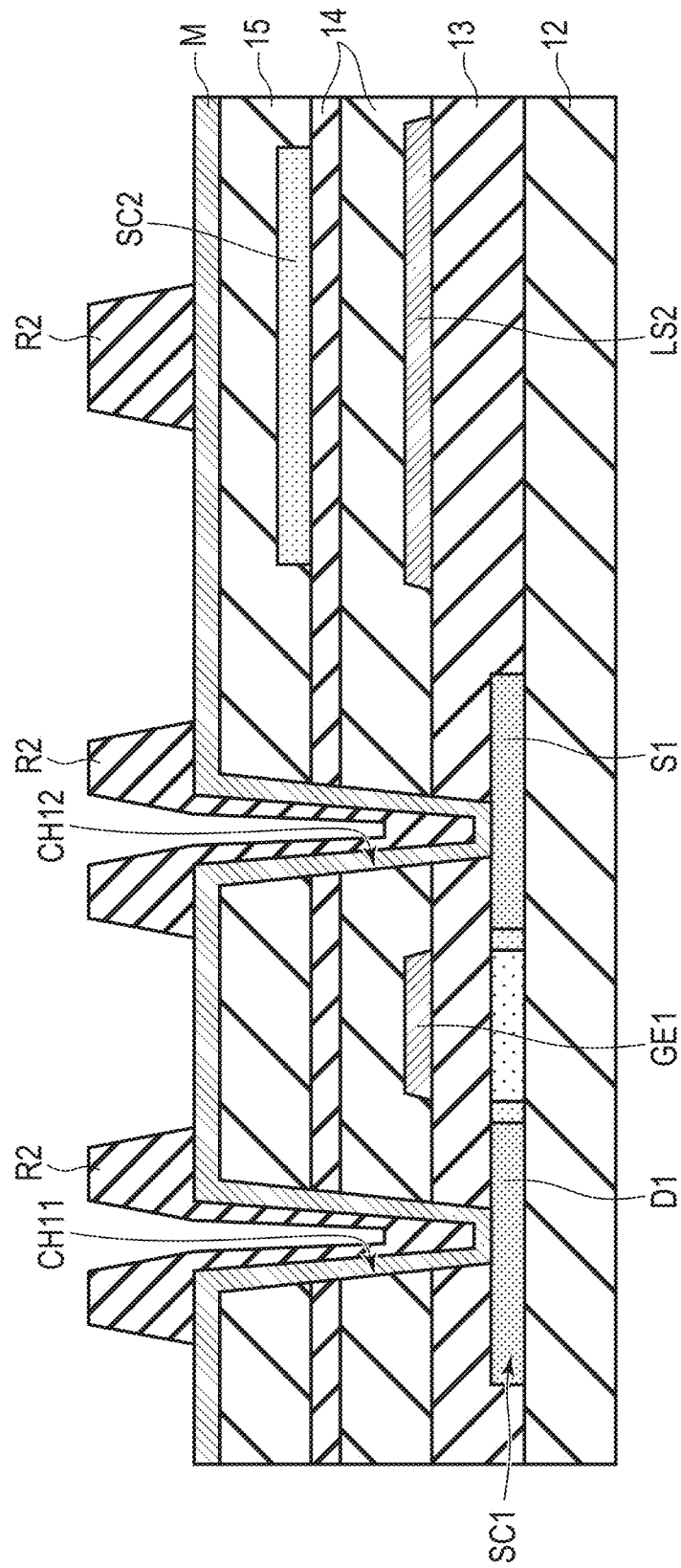
FIG. 7 is a cross-sectional view for explaining the method for manufacturing the transistors TR1 and TR2.

Then, as shown in FIG. 7, a resist R2 patterned in a desired shape is formed on the metal film M (step ST6). The resist R2 overlaps areas of the metal film M where the source electrode SE1, the drain electrode DE1, the gate electrode GE2 and the like should be formed. In addition, the resist R2 overlaps the metal film M in the contact holes CH11 and CH12.

Figure 8:
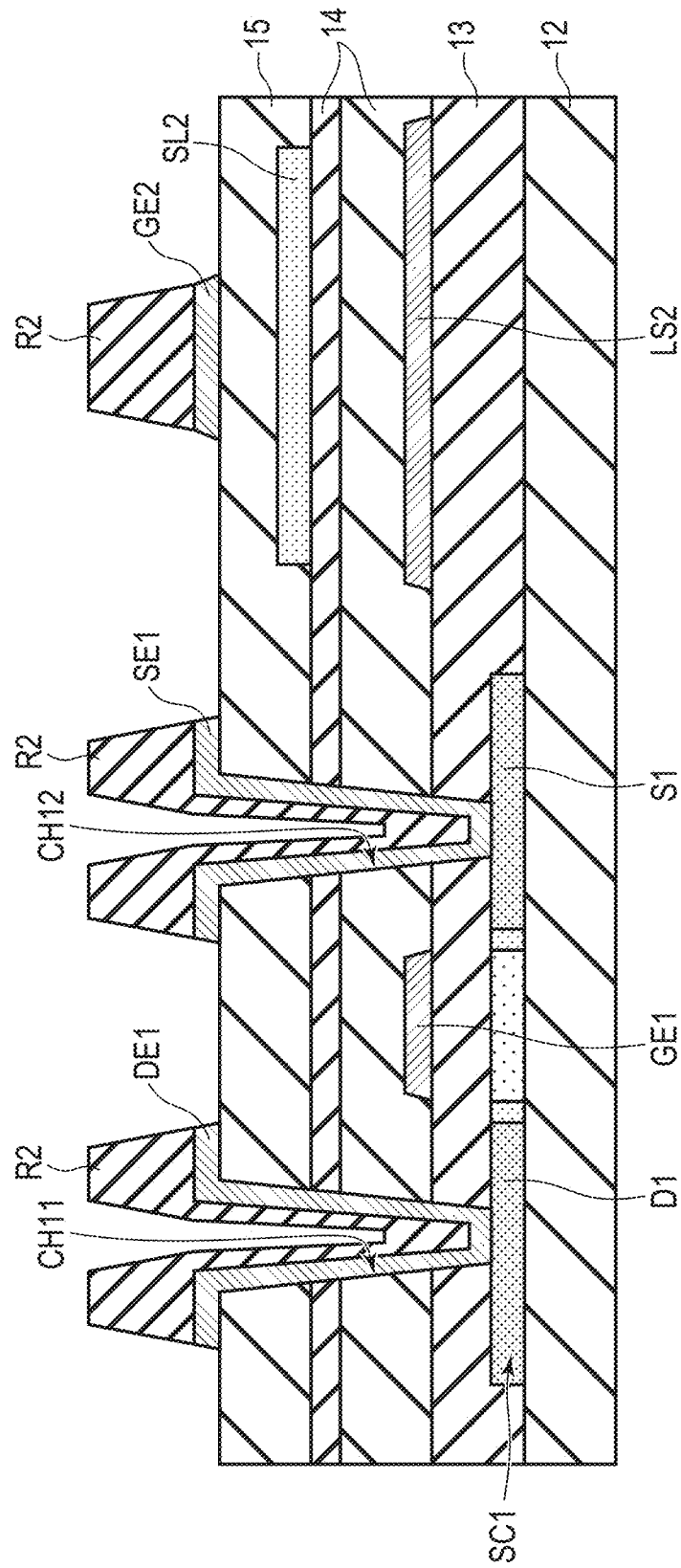
FIG. 8 is a cross-sectional view for explaining the method for manufacturing the transistors TR1 and TR2.

Then, as shown in FIG. 8, the metal film M is etched using the resist R2 as a mask, and the source electrode SE1 being in contact with the source area S1 in the contact hole CH12, the drain electrode DE1 being in contact with the drain area D1 in the contact hole CH11, the gate electrode GE2 overlapping the semiconductor SC2, and the like are formed (step ST7). When the metal film M is etched, the insulating film 15 is exposed in areas where the metal film M is removed.

Figure 9:
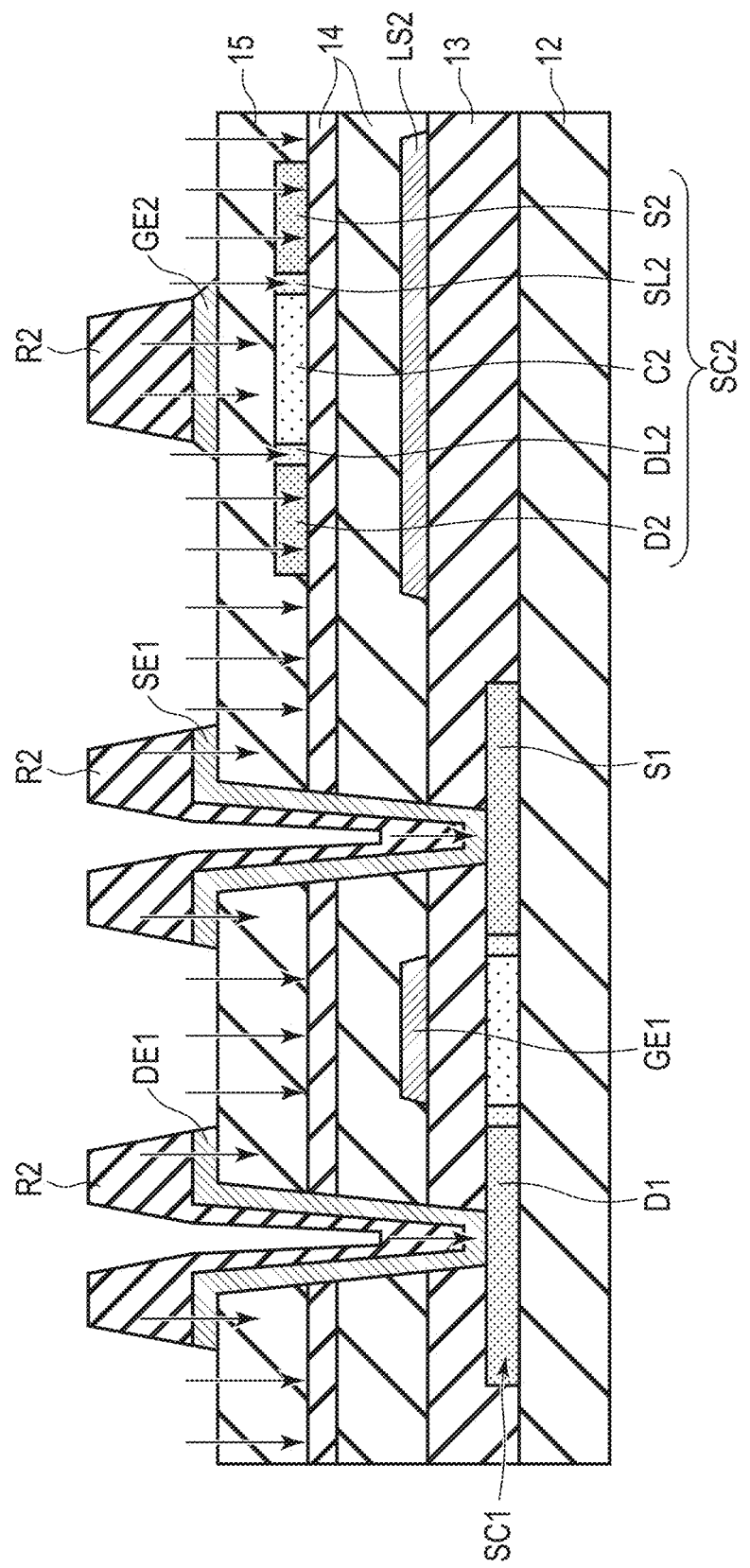
FIG. 9 is a cross-sectional view for explaining the method for manufacturing the transistors TR1 and TR2.

Then, as shown in FIG. 9, ions are implanted into the semiconductor SC2 without removing the resist R2 (step ST8). That is, ion implantation is performed using the source electrode SE1, the drain electrode DE1 and the gate electrode GE2 with the resist R2 stacked thereon as a mask. In one example, the semiconductor SC2 is doped with boron (E) as impurities by ion implantation. It should be noted that the semiconductor SC2 may be doped with phosphorus (P) or argon (Ar) instead of boron.

Accordingly, a channel area C2 which is hardly doped with impurities and a source area S2 and a drain area D2 which are doped with impurities are formed in the semiconductor SC2. In addition, in the illustrated example, a low-resistance area SL2 is formed between the channel area C22 and the source area S2, and a low-resistance area DL2 is formed between the channel area C2 and the drain area D2.

Figure 10:
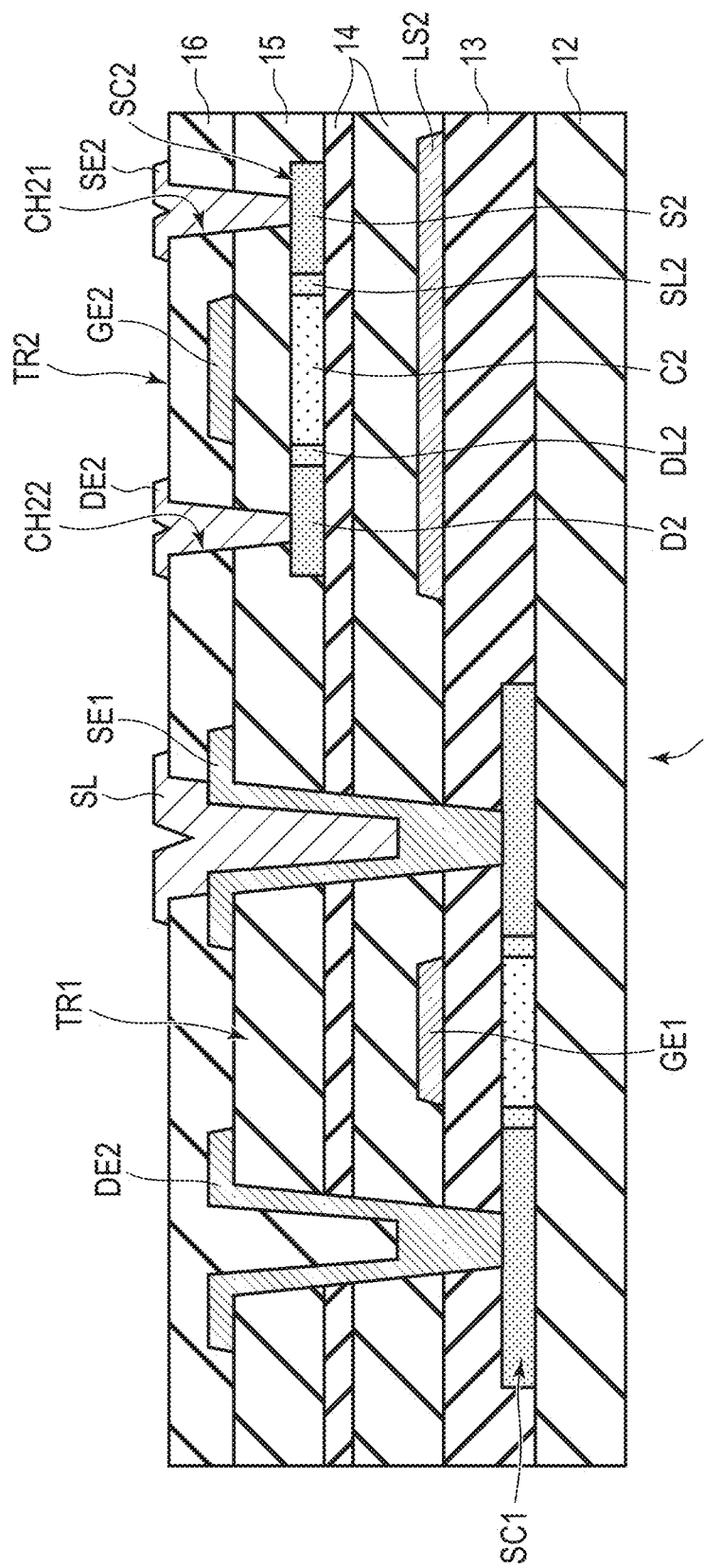
FIG. 10 is a cross-sectional view for explaining the method for manufacturing the transistors TR1 and TR2.

Then, as shown in FIG. 10, the resist R2 is removed (step ST9). After that, the insulating layer 16 is formed, contact holes CH21 and CH22 penetrating the insulating layers 15 and 16 are formed, and the source electrode SE2 and the drain electrode DE2 are formed. Accordingly, the semiconductor device 1 comprising the transistors TR1 and TR2 is manufactured.

As described above, after the polycrystalline silicon semiconductor SC1 is formed, in the process of forming the oxide semiconductor SC2, ions are implanted into the oxide semiconductor SC2 using the source electrode SE1, the drain electrode DE1 and the gate electrode GE2 with the resist R2 stacked thereon as a mask. Therefore, as compared with when ion implantation is performed after the resist R2 is removed, ion implantation into the polycrystalline silicon semiconductor SC1 via the source electrode SE1 and the drain electrode DE1 is suppressed. Accordingly, an increase in the contact resistance between the polycrystalline silicon semiconductor SC1 and the source electrode SE1 and an increase in the contact resistance between the polycrystalline silicon semiconductor SC1 and the drain electrode DE1 are suppressed. Consequently, the drive capability of the transistor can be improved.

In addition, an additional process for suppressing undesired ion implantation into the polycrystalline silicon semiconductor SC1 is not required, and an increase in the manufacturing cost is suppressed.

Incidentally, it is possible to suppress undesired ion implantation by increasing the film thicknesses of the source electrode SE1 and the drain electrode DE. However, since the gate electrode GE2 is formed simultaneously with the source electrode SE1, the film thickness of the gate electrode GE2 is also increased. It is undesirable because, when the film thicknesses of the electrodes are increased, insulation impairment where an insulating layer formed after the electrodes is disconnected by the edges of the electrodes occurs, or impairment such as short circuit with other conductive layers (electrode and wiring line) formed after the electrodes, disconnection thereof and the like occur.

Figure 11:
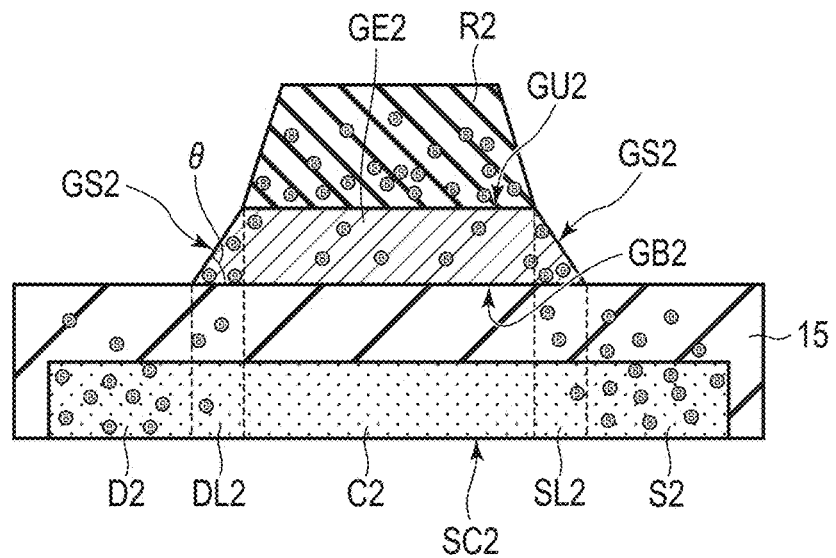
FIG. 11 is a cross-sectional view schematically showing impurity distribution after ion implantation.

FIG. 11 is a cross-sectional view schematically showing impurity distribution after ion implantation. The letter "B"s in the drawing represent boron (B) as implanted impurities.

In the gate electrode GE2 formed by etching using the resist R2 as a mask, the width of an upper surface GU2 which is in contact with the resist R2 is less than the width of a bottom surface GB2 which is in contact with the insulating layer 15. In addition, a side surface GS2 is an inclined surface, and an angle θ formed between the bottom surface GB2 and the side surface GS2 is an acute angle. In one example, the angle θ is about 60°.

In the semiconductor SC2, an area which overlaps the resist R2 and the gate electrode GE2 corresponds to the channel area (first area) C2, areas which are exposed from the resist R2 and overlap the gate electrode GE2 correspond to the low-resistance areas (second areas) DL2 and SL2, and areas which are exposed from the resist R2 and the gate electrode GE2 correspond to the source area (third area) S2 and the drain area (third area) D2. That is, the source area (third area) S2 and the drain area (third area) D2 do not overlap the gate electrode GE2.

The low-resistance areas SL1 and DL2 have a higher impurity concentration and a lower resistance than the channel area C2. The source area S2 and the drain area D2 have a higher impurity concentration and a lower resistance than the low-resistance areas SL2 and DL2. For an oxide semiconductor, a high impurity concentration means that the number of oxygen deficiencies per unit volume is large or the number of crystal defects per unit volume is large.

As shown in the drawing, impurities contained in the channel area C2 are extremely few, and impurities contained in an area of the insulating layer 15 located between the channel area C2 and the gate electrode GE2 are also extremely few. Impurities contained in the low-resistance area SL2 are more than impurities contained in the channel area C2 but less than impurities contained in the source area S2. In addition, impurities contained in the low-resistance area DL2 are more than impurities contained in the channel area C2 bus less than impurities contained in the drain electrode D2.

Figure 12:
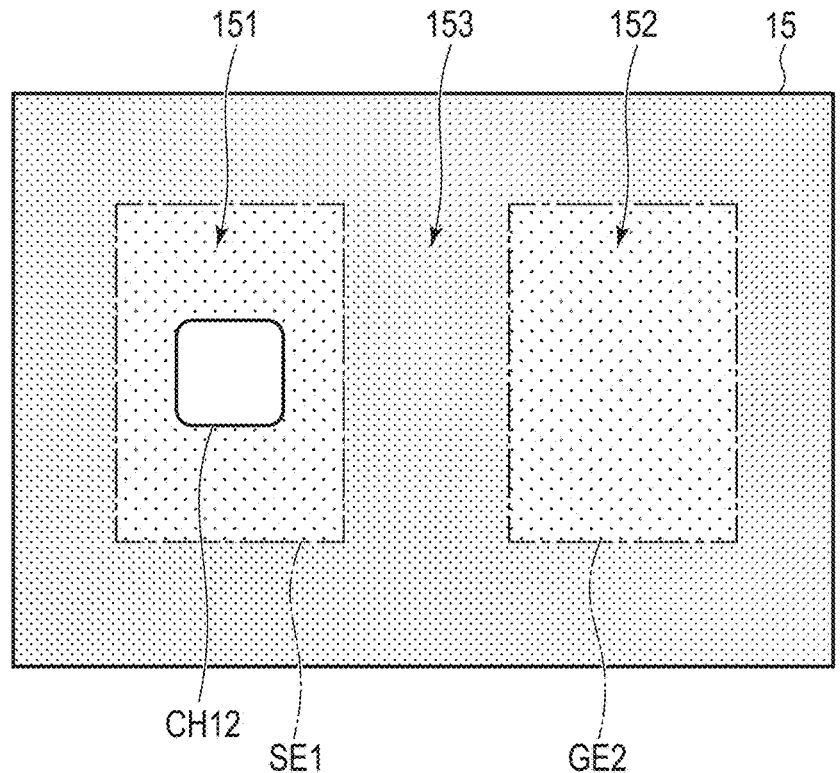
FIG. 12 is a plan view schematically showing impurity distribution after ion implantation.

FIG. 12 is a plan view schematically showing impurity distribution after ion implantation.

The insulating layer 15 has a first overlapping area 151 which overlaps the source electrode SE1, a second overlapping area 152 which overlaps the gate electrode GE2, and a peripheral area 153 which surrounds the first overlapping area 151 and the second overlapping area 152. The first overlapping area 151 is a frame-shaped area which surrounds the contact hole (first contact hole) CH12.

During ion implantation, since the resist R2 is stacked on the source electrode SE1 and the gate electrode GE2, the impurity concentration of the first overlapping area 151 is equal to the impurity concentration of the second overlapping area 152. It should be noted that the impurity concentration in an area of the insulating layer 15 overlapping the drain electrode DE1 is also equal to the impurity concentration of the first overlapping area 151.

On the other hand, the impurity concentration of the peripheral area 153 exposed from the resist R2 is higher than the impurity concentrations of the first overlapping area 151 and the second overlapping area 152. When the above manufacturing method is applied, impurity distribution as illustrated is formed in the insulating layer 15. In addition, the same impurity distribution as the insulating layer 15 is formed in the insulating layer 14. Since impurity concentration distribution is formed, an electric field applied to the channel is moderated, and the reliability of the transistor is improved.

Next, a modification of the method for manufacturing the semiconductor device according to the present embodiment will be described. The modification described here adds a process of reducing the volume of the resist R2 (step ST10) after the etching of the metal film M in step ST7 and before the ion implantation in step ST8 shown in FIG. 2.

Figure 13:
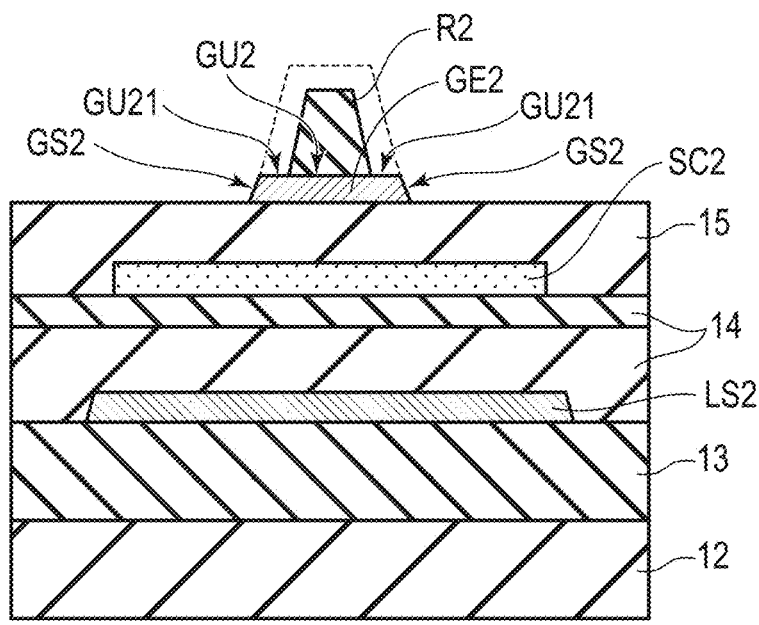
FIG. 13 is an illustration for explaining a process of reducing the volume of a resist R2.

FIG. 13 is an illustration for explaining the process of reducing the volume of the resist R2.

As a means for reducing the volume of the resist R2, for example, an ashing process can be applied. After the metal film M is etched using the resist R2 as a mask, the volume of the resist R2 is reduced by performing the ashing process. It should be noted that the volume of the resist R2 may be reduced by increasing the amounts of oxygen, nitrogen and the like introduced during the dry etching of the metal film M and reducing the selection ratio of the resist R2 and the metal film M instead of performing the ashing process.

Accordingly, the edge of the resist R2 recedes, and an upper surface GU21 of a part along the side surface GS2 of the upper surface GU2 of the gate electrode GE2 is exposed from the resist R2. The width of the exposed upper surface GU21 can be adjusted by ashing conditions.

Figure 14:
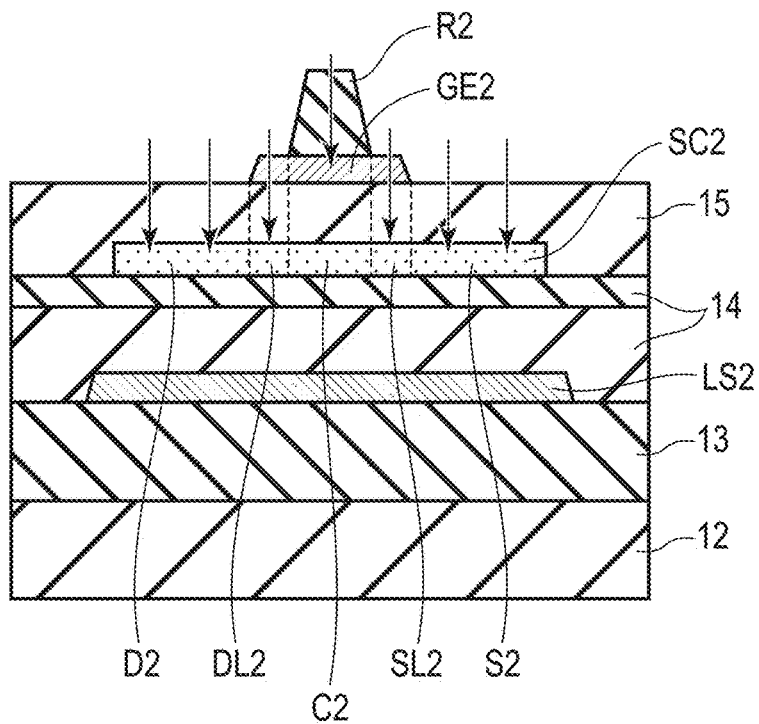
FIG. 14 is an illustration for explaining a process of performing ion implantation.

FIG. 14 is an illustration for explaining a process of performing ion implantation.

After the process of reducing the volume of the resist R2 described with reference to FIG. 13, ions are implanted into the semiconductor SC2 without removing the resist R2. That is, ion implantation is performed using the gate electrode GE2 with the resist R2 stacked thereon as a mask.

Accordingly, the channel area C2 which is hardly doped with impurities, the source area 32 and the drain area D2 which are doped with impurities, the low-resistance area SL2 between the channel area C2 and the source area S2, and the low-resistance area DL2 between the channel area C2 and the drain area D2 are formed in the semiconductor SC2.

FIG. 15 is a cross-sectional views schematically showing impurity distribution and oxygen deficiency distribution after ion implantation. The letter "B"s in the cross section on the left side of the drawing represent boron (B) as implanted impurities, and white circles in the cross section on the right side of the drawing schematically represent oxygen deficiencies caused by impurities.

In the semiconductor SC2, an area which overlaps the resist R2 and the gate electrode GE2 corresponds to the channel area (first area) C2, areas which are exposed from the resist R2 and overlap the gate electrode GE2 correspond to the low-resistance areas (second areas) DL2 and SL2, and areas which are exposed from the resist R2 and the gate electrode GE2 correspond to the source area (third area) S2 and the drain area (third area) D2.

As described above, the width of the upper surface GU21 exposed from the resist R2 can be adjusted by ashing conditions. Therefore, the widths of the low-resist areas DL2 and SL2 can also be adjusted freely by ashing conditions.

As shown in the cross section on the left side of the drawing, the low-resistance areas SL2 and DL2 have a higher impurity concentration and a lower resistance than the channel area C2. The source area S2 and the drain area D2 have a higher impurity concentration and a lower resistance than the low-resistance areas SL2 and DL2.

In addition, from another perspective, as shown in the cross section on the right side of the drawing, the low-resistance areas SL2 and DL2 have a larger number of oxygen deficiencies and a lower resistance than the channel area C2. The source area S2 and the drain area D2 have a larger number of oxygen deficiencies and a lower resistance than the low-resistance areas SL2 and As described above, the semiconductor SC2 constituting the transistor TR2 has the low-resistance area SL2 between the channel area C2 and the source area S2 and the low-resistance area DL2 between the channel area C2 and the drain area D2. Therefore, a high voltage resistance property can be obtained with respect to high voltage which could possibly be applied between the source and the drain.

As described above, according to the present embodiment, a semiconductor device capable of improving drive capability and reliability and a method for manufacturing the same can be provided.

All semiconductor devices, which are implementable with arbitrary changes in design by a person of ordinary skill in the art based on the semiconductor device described above as the embodiment of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be appropriately made to the above embodiment by a person of ordinary skill in the art, and these modifications also fall within the scope of the present invention as long as they encompass the spirit of the present invention.

In addition, the other advantages of the aspects described in the above embodiment, which are obvious from the descriptions of the specification or which are appropriately conceivable by a person of ordinary skill in the art, are considered to be achievable by the present invention as a matter of course.

What is claimed is:

1. A method for manufacturing a semiconductor device comprising:
    forming a first insulating layer above a polycrystalline silicon semiconductor;
    forming an island-shaped oxide semiconductor on the first insulating layer;
    forming a second insulating layer on the oxide semiconductor;
    forming a first contact hole and a second contact hole penetrating to the polycrystalline silicon semiconductor in a plurality of insulating layers including the first insulating layer and the second insulating layer;
    forming a metal film on the second insulating layer;
    forming a patterned resist on the metal film;
    etching the metal film using the resist as a mask, and forming a gate electrode overlapping the oxide semiconductor and a source electrode and a drain electrode being in contact with the polycrystalline silicon semiconductor respectively in the first contact hole and the second contact hole;
    performing ion implantation into the oxide semiconductor without removing the resist; and
    removing the resist.

2. The method for manufacturing the semiconductor device of claim 1, further comprising reducing a volume of the resist and exposing an upper surface of a part along a side surface of the gate electrode of an upper surface of the gate electrode, before performing the ion implantation.

3. The method for manufacturing the semiconductor device of claim 2, further comprising forming a first area, second areas having a lower resistance than the first area, and third areas having a lower resistance than the second areas in the oxide semiconductor by performing the ion implantation, wherein
    the first area overlaps the resist and the gate electrode,
    the second areas overlap the gate electrode exposed from the resist, and
    the third areas are exposed from the resist and the gate electrode.

4. The method for manufacturing the semiconductor device of claim 1, wherein the second insulating layer is formed of silicon oxide.

5. The method for manufacturing the semiconductor device of claim 1, further comprising:
    forming a side surface as an inclined surface when forming the gate electrode; and
    forming a first area overlapping the resist and the gate electrode, a second area overlapping the side surface of the gate electrode exposed from the resist, and a third area exposed from the resist and the gate electrode in the oxide semiconductor by performing the ion implantation, wherein the second area has a lower resistance than the first area, and
the third area has a lower resistance than the second area.

6. The method for manufacturing the semiconductor device of claim 5, wherein the resist exposes the side surface of the gate electrode and a part of an upper surface of the gate electrode when performing the ion implantation.

7. The method for manufacturing the semiconductor device of claim 1, further comprising forming a first overlapping area overlapping the source electrode, a second overlapping area overlapping the gate electrode, and a peripheral area surrounding the first overlapping area and the second overlapping area in the second insulating layer by performing the ion implantation, wherein
    an impurity concentration of the first overlapping area is equal to an impurity concentration of the second overlapping area, and
    an impurity concentration of the peripheral area is higher than the impurity concentrations of the first overlapping area and the second overlapping area.

8. A semiconductor device comprising:
    a base;
    a polycrystalline silicon semiconductor arranged above the base;
    a first gate electrode overlapping the polycrystalline silicon semiconductor;
    a first insulating layer arranged above the first gate electrode;
    an oxide semiconductor arranged on the first insulating layer;
    a second insulating layer covering the oxide semiconductor;
    a second gate electrode arranged on the second insulating layer and overlapping the oxide semiconductor; and
    a source electrode and a drain electrode arranged on the second insulating layer and being in contact with the polycrystalline silicon semiconductor, wherein
    the oxide semiconductor contains impurities,
    the second insulating layer has a first overlapping area overlapping the source electrode, a second overlapping area overlapping the second gate electrode, and a peripheral area surrounding the first overlapping area and the second overlapping area,
    an impurity concentration of the first overlapping area is equal to an impurity concentration of the second overlapping area,
    an impurity concentration of the peripheral area is higher than the impurity concentrations of the first overlapping area and the second overlapping area,
    the oxide semiconductor has a first area having a first impurity concentration, a second area having a second impurity concentration higher than the first impurity concentration, and a third area having a third impurity concentration higher than the second impurity concentration,
    the first area and the second area overlap the second gate electrode, and
    the third area does not overlap the second gate electrode.

9. The semiconductor device of claim 8, wherein
    the source electrode is in contact with the polycrystalline silicon semiconductor in a first contact hole penetrating the second insulating layer, and
    the first overlapping area is formed in a frame shape surrounding the first contact hole in planar view.

* * * * *